(12) United States Patent
Lee et al.

(10) Patent No.: US 12,484,260 B2
(45) Date of Patent: Nov. 25, 2025

(54) VERTICAL NAND FLASH MEMORY DEVICE AND METHOD OF MANUFACTURING THE SAME

(71) Applicant: Samsung Electronics Co., Ltd., Suwon-si (KR)

(72) Inventors: Minhyun Lee, Suwon-si (KR); Taein Kim, Seoul (KR); Youngtek Oh, Suwon-si (KR); Suhyeong Lee, Hwaseong-si (KR); Gukhyon Yon, Hwaseong-si (KR); Dongkyu Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 697 days.

(21) Appl. No.: 17/578,981

(22) Filed: Jan. 19, 2022

(65) Prior Publication Data
US 2022/0238672 A1     Jul. 28, 2022

(30) Foreign Application Priority Data

Jan. 25, 2021  (KR) .................. 10-2021-0010265
Dec. 29, 2021  (KR) .................. 10-2021-0191651

(51) Int. Cl.
*H10D 30/69*     (2025.01)
*H10B 43/27*     (2023.01)
(Continued)

(52) U.S. Cl.
CPC ........... *H10D 30/697* (2025.01); *H10B 43/27* (2023.02); *H10D 64/037* (2025.01); *H10D 64/681* (2025.01)

(58) Field of Classification Search
CPC ......... H01L 29/42348; H01L 29/40117; H10B 43/30; H10D 30/697; H10D 64/037
See application file for complete search history.

(56) References Cited

U.S. PATENT DOCUMENTS 7,015,336 B2  3/2006  Reed et al.
7,482,660 B2  1/2009  Osari
(Continued)

FOREIGN PATENT DOCUMENTS

KR    100759613 B1    9/2007
KR    100808966 B1    3/2008
(Continued)

OTHER PUBLICATIONS

Islamov et al., "The Evolution of the Conductivity and Cathodoluminescence of the Films of Hafnium Oxide in the Case of a Change in the Concentration of Oxygen Vacancies", Optical Properties (2019): pp. 2050-2057 (Year: 2019).*

(Continued)

*Primary Examiner* — Michele Fan
(74) *Attorney, Agent, or Firm* — HARNESS, DICKEY & PIERCE, P.L.C.

(57) ABSTRACT

A vertical NAND flash memory device and a method of manufacturing the same are provided. The vertical NAND flash memory device includes a charge trap layer arranged on an inner wall of a channel hole vertically formed on a substrate. The charge trap layer includes nanostructures distributed in a base. The nanostructures may include a material having a trap density of about $1 \times 10^{19}$ cm$^{-3}$ to about $10 \times 10^{19}$ cm$^{-3}$, and the base may include a material having a conduction band offset (CBO) of about 0.5 eV to about 3.5 eV with respect to the material included in the nanostructures.

26 Claims, 14 Drawing Sheets

(51) Int. Cl.
    *H10D 64/01*         (2025.01)
    *H10D 64/68*         (2025.01)

(56) References Cited

U.S. PATENT DOCUMENTS

| | | | |
|---|---|---|---|
| 7,719,047 | B2 | 5/2010 | Choi et al. |
| 7,820,064 | B2 | 10/2010 | Jin |
| 8,125,247 | B2 | 2/2012 | Koo et al. |
| 8,421,060 | B2 | 4/2013 | Koo et al. |
| 8,462,557 | B2 | 6/2013 | Bhattacharyya |
| 8,587,044 | B2 | 11/2013 | Koo et al. |
| 8,610,194 | B2 * | 12/2013 | Aritome ........... H10B 41/27 257/314 |
| 9,202,819 | B2 | 12/2015 | Lee et al. |
| 9,449,985 | B1 | 9/2016 | Rabkin et al. |
| 9,515,086 | B2 | 12/2016 | Yon et al. |
| 10,115,730 | B1 * | 10/2018 | Baraskar ........... H10B 43/27 |
| 2006/0001053 | A1 | 1/2006 | Wang |
| 2007/0064468 | A1 | 3/2007 | Seol et al. |
| 2008/0009115 | A1 * | 1/2008 | Willer ............... H10B 43/10 438/257 |
| 2012/0146109 | A1 * | 6/2012 | Yamazaki ........ H01L 29/7833 257/288 |
| 2012/0276696 | A1 | 11/2012 | Yang et al. |
| 2013/0087843 | A1 | 4/2013 | Han |
| 2016/0110102 | A1 | 4/2016 | Lee |

FOREIGN PATENT DOCUMENTS

| | | | |
|---|---|---|---|
| KR | 100873073 B1 | | 12/2008 |
| KR | 20090123327 A | * | 12/2009 |
| KR | 100979842 B1 | | 9/2010 |
| KR | 101016437 B1 | | 2/2011 |
| KR | 101032502 B1 | | 5/2011 |
| KR | 101084019 B1 | | 11/2011 |
| KR | 101112431 B1 | | 2/2012 |
| KR | 2013/0053097 A | | 5/2013 |
| KR | 101283934 B1 | | 7/2013 |
| KR | 2016/0046391 A | | 4/2016 |
| KR | 102108098 B1 | | 5/2020 |

OTHER PUBLICATIONS

Lin et al., "High-Performance Nonvolatile HfO2 Nanocrystal Memory", IEEE Electron Device Letters, 26 (2005): pp. 154-156 (Year: 2005).*

Gritsenko et al., "Electronic properties of hafnium oxide: A contribution from defects and traps", Physics Reports, 613 (2016): pp. 1-20 (Year: 2016).*

Extended European Search Report dated Jul. 7, 2022, issued in corresponding European Patent Application No. 22152140.4.

Hironori Wakai et al., "Ultrahigh-Density HfO$_2$ Nanodots for Flash Memory Scaling" Japanese Journal of Applied Physics, vol. 45, No. 4A, Apr. 2006, pp. 2459-2462, XP001245738.

Jun-Kyo Jeong et al., 'Charge Migration Analysis of 3D SONOS NAND Flash Memory Using Test Pattern' *Journal of Semiconductor Technology and Science*, vol. 20, No. 2, Apr. 2020, pp. 151-157.

Tae-Yon Lee et al., 'Low thermal conductivity in Ge$_2$Sb$_2$Te$_5$—SiO$_x$ for phase change memory devices' *Applied Physics Letters*, vol. 94, Jun. 2009, pp. 243103-1-243103-3.

S.H. Sheng et al., 'Decomposition mechanism of Al$_{1-x}$Si$_x$N$_y$ solid solution possible mechanism of the formulation of covalent nanocrystalline AlN/Si$_3$N$_4$ nanocomposites' *Acta Materialia*, vol. 61, 2013, pp. 4226-4236.

A. Pélisson et al., 'Microstructure and mechanical properties of Al—Si—N transparent hard coatings deposited by magnetron sputtering' *Surface & Coatings Technology*, vol. 202, 2007, pp. 884-889.

S.H. Sheng et al., 'Study of spinodal decomposition and formation of nc-Al$_2$O$_3$/ZrO$_2$ nanocomposites by combined ab initio density functional theory and thermodynamic modeling' *Acta Materialia*, vol. 59, 2011, pp. 3498-3509.

Bongsik Choi et al., 'Comprehensive evaluation of early retention (fast charge loss within a few seconds) characteristics in tube-type 3-D NAND flash memory' *2016 IEEE Symposium on VLSI Technology*, 2016, pp. 1-2, doi: 10.1109/VLSIT.2016.7573385.

Yulia A. Nalench et al., "Unravelling the Nucleation, Growth, and Faceting of Magnetite[1]Gold Nanohybrids", J. Mater. Chem. B, 8, 3886 (2020), DOI:10.1039/C9TB02721A.

M. Zacharias et al., "Nanocrystalline silicon superlattices: fabrication and characterization", Journal of Non-Crystalline Solids, 227-230, 1132-1136. (1998), DOI:10.1016/S0022-3093(98)00287-7.

Y.M. Wan et al., "Development of silicon nitride dots for nanocrystal memory cells", Solid-State Electronics, 48(9), 1519-1524. (2004), DOI:10.1016/j.sse.2004.03.020.

Ting-Chang Chang et al., "Developments in nanocrystal memory", Materials Today, 14(12), 608-615. (2011), DOI:10.1016/S1369-7021(11)70302-9.

Korean Office Action dated Aug. 22, 2025 for corresponding Korean Patent Application No. 10-2021-0191651 and its English-language translation.

* cited by examiner

VERTICAL NAND FLASH MEMORY DEVICE AND METHOD OF MANUFACTURING THE SAME

CROSS-REFERENCE TO RELATED APPLICATION

This application is based on and claims priority under 35 U.S.C. § 119 to Korean Patent Application Nos. 10-2021-0010265, filed on Jan. 25, 2021, and 10-2021-0191651, filed on Dec. 29, 2021, in the Korean Intellectual Property Office. The entire disclosure of each application is incorporated by reference herein.

BACKGROUND

1. Field

The present disclosure relates to a vertical NAND flash memory device and/or a method of manufacturing the same.

2. Description of the Related Art

As the hard disk has been replaced by a solid state drive (SSD), a NAND flash memory device, which is a nonvolatile memory device, has been widely commercialized. Recently, based on miniaturization and high integration, a vertical NAND flash memory device, in which a plurality of memory cells are stacked in a direction vertical to a substrate, has been developed.

In the vertical NAND flash memory device, due to an increase in the number of stacked memory cells and a decrease in the heights of the stacked memory cells, a charge mobility between the memory cells may occur, and thus, the charge retention characteristics of the memory cells may deteriorate.

SUMMARY

Provided are a vertical NAND flash memory device and/or a method of manufacturing the same.

Additional aspects will be set forth in part in the description which follows and, in part, will be apparent from the description, or may be learned by practice of the presented embodiments of the disclosure.

According to an embodiment, a vertical NAND flash memory device may include a substrate; a structure on substrate including a plurality of conductive layers arranged in parallel to an upper surface of the substrate, the structure including a channel hole formed vertical to the substrate and penetrating the plurality of conductive layers; a charge trap layer on an inner wall of the channel hole, the charge trap layer including a base and nanostructures distributed in the base; and a channel layer on the charge trap layer. The nanostructures may include a material having a trap density of about $1 \times 10^{19}$ cm$^{-3}$ to about $10 \times 10^{19}$ cm$^{-3}$, and the base may include a material having a conduction band offset (CBO) of about 0.5 eV to about 3.5 eV with respect to the material included in the nanostructures.

In some embodiments, the trap density of the material included in the nanostructures may be about $2 \times 10^{19}$ cm$^{-3}$ to about $5 \times 10^{19}$ cm$^{-3}$.

In some embodiments, the material included in the base may have a higher band gap than the material included in the nanostructures.

In some embodiments, the CBO of the material included in the base may be about 1.0 eV to about 2.0 eV with respect to the material included in the nanostructures.

In some embodiments, the nanostructures may include at least one of SiN, GaN, GaO, HfO, ScO, SrO, ZrO, YO, TaO, BaO, and ZnS.

In some embodiments, the base may include at least one of SiO, AlO, MgO, AlN, BN, and GaN.

In some embodiments, a combination of the material included in the nanostructures and the material included in the base may include a combination of HfO and SiO, a combination of HfO and AlO, a combination of SiN and AlO, or a combination of ZrO and AlO.

A size of the nanostructures may be about 1 nm to about 20 nm. The size of the nanostructures may be about 3 nm to about 5 nm.

In some embodiments, a gap between the nanostructures may be about 2 nm to about 25 nm. The gap between the nanostructures may be about 2 nm to about 10 nm.

In some embodiments, a ratio of a volume of the nanostructures in the charge trap layer to a volume of the charge trap layer may be about 15% to about 75%. The ratio of the volume of the nanostructures in the charge trap layer to the volume of the charge trap layer may be about 25% to about 60%.

In some embodiments, the base may have an amorphous structure, and the nanostructures have a crystalline structure or an amorphous structure.

In some embodiments, the charge trap layer may be formed by inducing spinodal decomposition through a heat treatment process on a mixture of the material included in the base and the material included in the nanostructures.

In some embodiments, the charge trap layer may have a surface roughness that is equal to or less than about 2 nm root-mean-square (RMS).

In some embodiments, the nanostructures may be buried in the base. At least one of the nanostructures may be exposed from the base.

In some embodiments, a gap between the conductive layers may be equal to or less than about 30 nm.

In some embodiments, the structure on the substrate may include an insulating layer between the conductive layers and the insulating layer may extend in parallel to the substrate.

In some embodiments, the vertical NAND flash memory device may further include a barrier dielectric layer between the charge trap layer and the plurality of conductive layers.

In some embodiments, the vertical NAND flash memory device may further include a tunneling dielectric layer between the charge trap layer and the plurality of channel layers.

In some embodiments, the vertical NAND flash memory device may further include a filling dielectric layer on an inner side of the channel layer and the filling dielectric layer may fill the channel hole.

According to an embodiment, a method of manufacturing a vertical NAND flash memory device may include alternately stacking a first layer and a second layer on a substrate; forming a channel hole in the first layer and the second layer, the channel hole penetrating the layer and the second layer in a direction vertical to the substrate; and forming a charge trap layer on an inner wall of the channel hole. The charge trap layer may include a base and nanostructures distributed in the base. The forming the charge trap layer may include forming a mixture material layer on the inner wall of the channel hole and inducing spinodal decomposition by performing a heat treatment process on the mixture material layer. The mixture material layer may include a material included in the base and a material included in the nanostructures.

In some embodiments, the material included in the nanostructures may have a trap density of about $1\times10^{19}$ cm$^{-3}$ to about $10\times10^{19}$ cm$^{-3}$ and the material included in the base may have a conduction band offset (CBO) of about 0.5 eV to about 3.5 eV with respect to the material included in the nanostructures.

In some embodiments, the trap density of the material included in the nanostructures may be about $2\times10^{19}$ cm$^{-3}$ to about $5\times10^{19}$ cm$^{-3}$.

In some embodiments, the material included in the nanostructures may include at least one of SiN, GaN, GaO, HfO, ScO, SrO, ZrO, YO, TaO, BaO, and ZnS.

In some embodiments, the CBO of the material included in the base may be about 1.0 eV to about 2.0 eV with respect to the material included in the nanostructures.

In some embodiments, the material included in the base may include at least one of SiO, AlO, MgO, AlN, BN, and GaN.

In some embodiments, a combination of the material included in the nanostructures and the material included in the base may include a combination of HfO and SiO, a combination of HfO and AlO, a combination of SiN and AlO, or a combination of ZrO and AlO.

In some embodiments, the forming the mixture material layer on the inner wall of the channel hole may be performed by atomic layer deposition (ALD).

In some embodiments, the charge trap layer may be formed to have a surface roughness that is equal to or less than about 2 nm root-mean-square (RMS).

In some embodiments, a size of the nanostructures may be about 1 nm to about 20 nm.

In some embodiments, a gap between the nanostructures may be about 2 nm to about 25 nm.

In some embodiments, the ratio of a volume of the nanostructures in the charge trap layer to a volume of the charge trap layer may be about 15% to about 75%.

In some embodiments, the nanostructures may be buried in the base, or at least one of the nanostructures may be exposed from the base.

In some embodiments, the first layer may include a first insulating material, and the second layer may include a conductive material.

In some embodiments, the first layer may include a first insulating material, and the second layer may include a second insulating material. In this case, the method may further include forming a conductive layer on the substrate after removing the second layer.

According to an example embodiment, a vertical NAND flash memory device may include a substrate; a plurality of conductive layers and a plurality of insulating layers alternately stacked on an upper surface of the substrate; and a channel structure. The plurality of conductive layers and the plurality of insulating layers may define a channel hole extending in a vertical direction through the plurality of conductive layers and the plurality of insulating layers. The channel structure may be in the channel hole. The channel structure may include a channel layer extending the vertical direction. The channel structure may include a plurality of nanostructures distributed in a base between the channel layer and a sidewall of the channel hole. A material included in the plurality of nanostructures may have a lower band gap compared to a material included in the base. The material included in the nanostructures may have a trap density of about $1\times10^{19}$ cm$^{-3}$ to about $10\times10^{19}$ cm$^{-3}$. A conduction band offset (CBO) of the material included in the base with respect to the material included in the nanostructures may be about 0.5 eV to about 3.5 eV.

In some embodiments, the base may have an amorphous structure and the plurality of nanostructures may have a crystalline structure or an amorphous structure. The plurality of nanostructures may have at least one of a spherical shape, an oval shape, and a rod shape.

In some embodiments, the material included in the plurality of nanostructures may include at least one of SiN, GaN, GaO, HfO, ScO, SrO, ZrO, YO, TaO, BaO, and ZnS, and the material included in the base may include at least one of SiO, AlO, MgO, AlN, BN, and GaN.

In some embodiments, the channel structure may include at least one of: a barrier dielectric layer between the channel layer and plurality of nanostructures distributed in the base; and a tunneling dielectric layer between the channel layer and plurality of nanostructures distributed in the base.

In some embodiments, the channel structure may include a charge trap layer containing the plurality of nanostructures distributed in the base. A surface roughness of the charge trap layer may be equal to or less than about 2 nm RMS.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
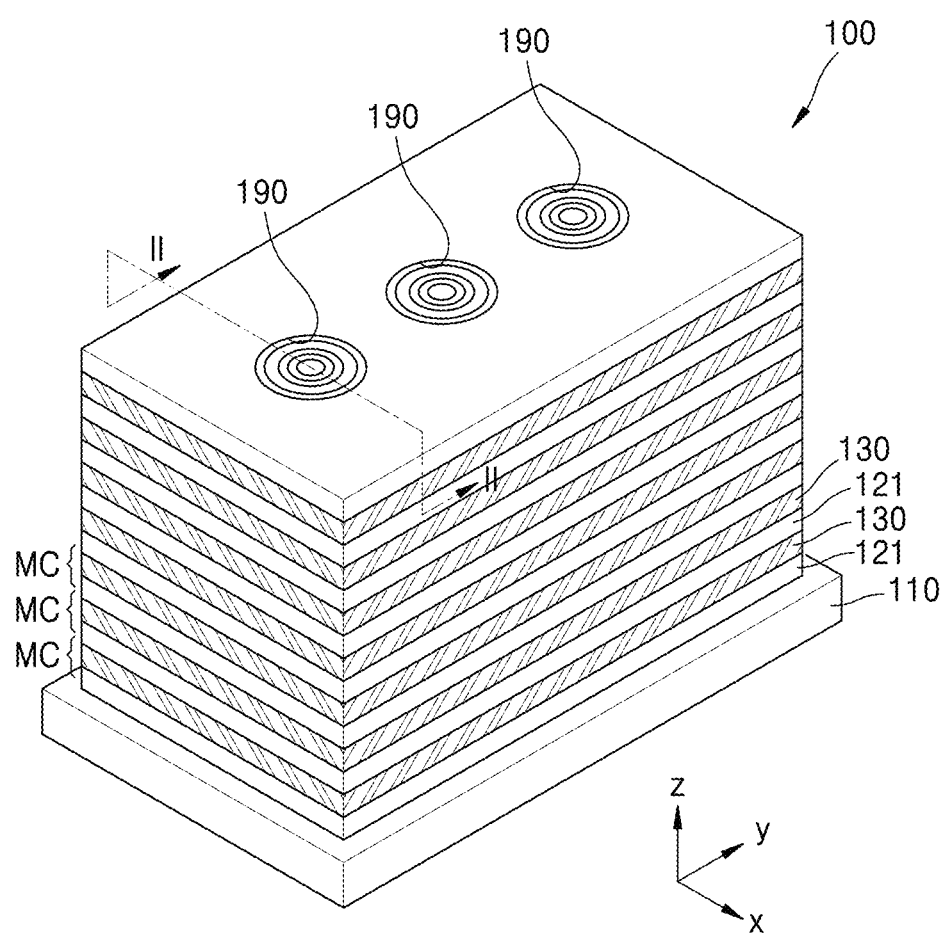
FIG. 1 schematically illustrates a vertical NAND flash memory device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

Hereinafter, example embodiments will be described in detail by referring to the accompanying drawings. In the drawings, the same reference numerals denote the same elements and sizes of elements may be exaggerated for clarity and convenience of explanation. Also, the embodiments described hereinafter are only examples, and various modifications may be made based on the embodiments.

Hereinafter, it will be understood that when an element is referred to as being "on" or "above" another element, the element can be directly over or under the other element and directly on the left or on the right of the other element, or intervening elements may also be present therebetween. As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements.

The term "the" and other equivalent determiners may correspond to a singular referent or a plural referent. Operations included in a method may be performed in an appropriate order, unless the operations included in the method are described to be performed in an apparent order, or unless the operations included in the method are described to be performed otherwise.

Also, the terms such as " . . . unit," "module," or the like used in the specification indicate a unit, which processes at least one function or motion, and the unit may be implemented by hardware or software, or by a combination of hardware and software.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The connecting lines, or connectors shown in the various figures presented are intended to represent example functional relationships and/or physical or logical couplings between the various elements. It should be noted that many alternative or additional functional relationships, physical connections or logical connections may be present in a practical device.

All examples and example expressions are only used to describe the disclosure in detail, and unless it is defined by the scope of the claims, these examples and example expressions do not limit the scope of the disclosure.

FIG. 1 schematically illustrates a vertical NAND flash memory device 100 according to an example embodiment.

Referring to FIG. 1, the vertical NAND flash memory device 100 may include a substrate 110 and a plurality of memory cells MCs stacked in a direction vertical to a surface of the substrate 110 (that is, a z-axis direction in FIG. 1). The plurality of memory cells MCs may include insulating layers 121 and conductive layers 130 alternately stacked in the direction vertical to the surface of the substrate 110. Also, a plurality of channel holes 190 may be formed through the insulating layers 121 and the conductive layers 130 in a direction vertical to the substrate 110. The insulating layer 121 and conductive layer 130 alternately stacked may be referred to as a stacked structure and the stacked structure may define the channel holes 190. FIG. 1 illustrates an example in which the channel holes 190 are arranged to have a shape of a one-dimensional (1D) array. However, the channel holes 190 are not limited thereto and may be arranged to have a shape of a two-dimensional (2D) array.

Figure 2:
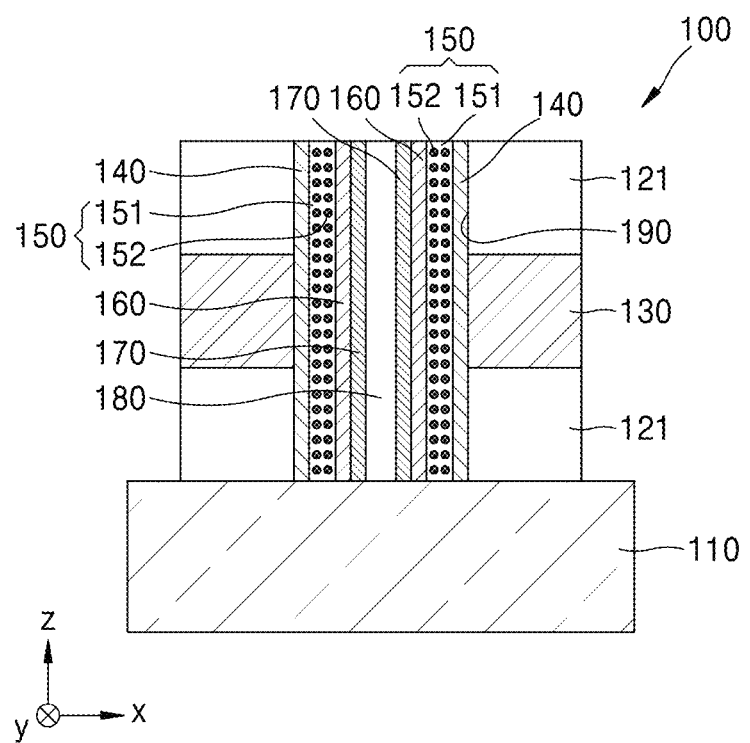
FIG. 2 is a cross-sectional view of the vertical NAND flash memory device taken along line II-II' of FIG. 1.

FIG. 2 is a cross-sectional view of the vertical NAND flash memory device 100 of FIG. 1, taken along line II-II' of FIG. 1. For convenience, FIG. 2 illustrates a cross-section of one of the plurality of memory cells MCs of the vertical NAND flash memory device 100, which will be likewise applied to the drawings to be described hereinafter.

Referring to FIG. 2, the insulating layer 121 and the conductive layer 130 may be alternately stacked on the substrate 110 in a direction vertical to a surface (that is, an x-y plane of FIG. 2) of the substrate 110. Here, each of the insulating layer 121 and the conductive layer 130 may be provided to extend in a direction parallel to the surface of the substrate.

The substrate 110 may include various materials. For example, the substrate 110 may include a monocrystalline silicon substrate, a compound semiconductor substrate, or a silicon on insulator (SOI) substrate, but is not limited thereto. Also, the substrate 110 may further include, for example, an impurity area that is doped with impurities, an electronic device such as a transistor, etc., or a peripheral circuit, etc. configured to select and control memory cells for storing data.

The conductive layer 130 may be a control gate, and a word line (not shown) may be electrically connected to the conductive layer 130. The conductive layer 130 may include, for example, a metal material having excellent electrical conductivity such as Au, silicon doped with impurities, or the like. However, it is only an example, and the conductive layer 130 may include other various materials.

The insulating layer 121 may function as a spacer layer for the insulations between the conductive layers 130. The insulating layer 121 may include, for example, silicon oxide (SiO), silicon nitride (SiN), etc., but is not limited thereto.

The channel hole 190 may be formed through the insulating layer 121 and the conductive layer 130. Here, the channel hole 190 may be formed to extend in a direction vertical to the surface of the substrate 110 (that is, a z-axis direction of FIG. 2). The channel hole 190 may be formed to have a circular cross-section.

A barrier dielectric layer 140, a charge trap layer 150, and a tunneling dielectric layer 160 may be sequentially provided on an inner wall of the channel hole 190. Here, when a certain voltage is applied to the conductive layer 130, which is a control gate, a charge flowing between a source and a drain of a channel layer 170, which is to be described below, may pass through the tunneling dielectric layer 160 so as to be trapped in the charge trap layer 150, and thus, information may be stored.

Each of the barrier dielectric layer 140, the charge trap layer 150, and the tunneling dielectric layer 160 may be provided to extend in the direction vertical to the surface of the substrate 110. Each of the barrier dielectric layer 140, the charge trap layer 150, and the tunneling dielectric layer 160 may be provided to have a cylindrical shape.

The barrier dielectric layer 140 may be provided at the inner wall of the channel hole 190 to contact the insulating layer 121 and the conductive layer 130. The barrier dielectric layer 140 may include, for example, SiO or metal oxide, but is not limited thereto.

The charge trap layer 150 may be provided on an inner side of the barrier dielectric layer 140. The charge trap layer 150 may include a base 151 and nanostructures 152 distributed in the base 151.

Here, the nanostructures 152 may include a material having the excellent charge trap characteristics, and the base 151 may include a material having the excellent blocking characteristics with respect to a charge mobility. The nanostructures 152 may have a crystalline structure or an amorphous structure, and the base 151 may have an amorphous structure.

The material included in the nanostructures 152 may have a greater trap density than the material included in the base 151. In detail, the material included in the nanostructures 152 may have a trap density of $1 \times 10^{19}$ cm$^{-3}$ to $10 \times 10^{19}$ cm$^{-3}$. For example, the material included in the nanostructures 152 may have a trap density of $1 \times 10^{19}$ cm$^{-3}$ to $6 \times 10^{19}$ cm$^{-3}$. For example, the material included in the nanostructures 152 may have a trap density of $2 \times 10^{19}$ cm$^{-3}$ to $5 \times 110^{19}$ cm$^{-3}$.

The material included in the base 151 may have a greater band gap than the material included in the nanostructures 152. Also, the material included in the base 151 may have a conduction band offset (CBO) having a value that is equal to or greater than a desired and/or alternatively predetermined value with respect to the material included in the nanostructures 152. Here, the CBO denotes a difference between an energy level of a conduction band of the material included in the nanostructures 152 and an energy level of a conduction band of the material included in the base 151.

The material included in the base 151 may have a CBO of 0.5 eV to 3.5 eV with respect to the material included in the nanostructures 152. For example, the material included in the base 151 may have a CBO of 1.0 eV to 2.0 eV with respect to the material included in the nanostructures 152. For example, the material included in the base 151 may have a CBO of 1.0 eV to 1.5 eV with respect to the material included in the nanostructures 152.

The nanostructures 152 may include or be formed of, for example, at least one of SiN, GaN, GaO, HfO, ScO, SrO, ZrO, YO, TaO, BaO, and ZnS. However, it is not limited thereto.

The base 151 may include, for example, at least one of SiO, AlO, MgO, AlN, BN, and GaN. However, it is not limited thereto.

A combination of the materials of the nanostructures 152 and the base 151 may include, for example, a combination of HfO and SiO, a combination of HfO and AlO, a combination of SiN and AlO, or a combination of ZrO and AlO. However, it is only an example.

The nanostructures 152 may have, for example, a spherical shape, an oval shape, a disk shape, or a rod shape. The nanostructures 152 may have a desired and/or alternatively predetermined nano-level size. Here, the size of the nanostructures 152 may be defined to have the following meaning according to a shape of the nanostructures 152. When the nanostructures 152 have a spherical shape or an oval shape, the size of the nanostructures 152 may denote an average diameter of the nanostructures 152. When the nanostructures 152 have a disk shape, the size of the nanostructures 152 may denote a thickness of the nanostructures 152. Also, when the nanostructures 152 have a rod shape, the size of the nanostructures 152 may denote a sectional diameter of the nanostructures 152.

According to the present embodiment, the nanostructures 152 may have a size of about 1 nm to about 20 nm. For example, the nanostructures 152 may have a size of 2 nm to 10 nm. For example, the nanostructures 152 may have a size of 3 nm to 5 nm.

The nanostructures 152 may be arranged in the base 151 to have a desired and/or alternatively predetermined gap between each other. Here, the gap between the nanostructures 152 may be defined to be a distance between centers of adjacent nanostructures 152. According to the present embodiment, the gap between the nanostructures 152 may be 2 nm to 25 nm. For example, the gap between the nanostructures 152 may be 2 nm to 15 nm. For example, the gap between the nanostructures 152 may be 2 nm to 10 nm. A thickness of a base material between the nanostructures 152 may be about 1 nm to about 5 nm.

A ratio (that is, a volume ratio) of the nanostructures 152 in the charge trap layer 150 may be about 15% to about 75%. For example, the ratio of the nanostructures 152 in the charge trap layer 150 may be about 25% to about 65%.

The size, the distribution, etc. of the nanostructures 152 described above may be measured, for example, by a transmission electron microscopy (TEM) analysis. In addition, the size of the nanostructures 152 may be measured, for example, by an X-ray diffraction (XRD) analysis or a photoluminescence (PL) analysis.

The charge trap layer 150 including the base 151 and the nanostructures 152 distributed in the base 151 may be formed by forming a mixture of the material included in the base 151 and the material included in the nanostructures 152 via atomic layer deposition (ALD) and inducing spinodal decomposition by performing heat treatment on the mixture, as described below. Here, the spinodal decomposition may occur when formation energy according to the mixing of the material included in the base 151 and the material included in the nanostructures 152 at a desired and/or alternatively predetermined temperature, that is, a Gibbs free-energy change ($\Delta G$), is greater than 0. The shape and the size of the nanostructures 152 may be adjusted according to a temperature of the heat treatment on the mixture of the material included in the base 151 and the material included in the nanostructures 152.

As described above, the charge trap layer 150 may be formed via the ALD and the spinodal decomposition, and thus, the charge trap layer 150 may have a relatively more uniform surface. For example, the charge trap layer 150 may be formed to have a surface roughness that is equal to or less than about 2 nm root-mean-square (RMS). As a specific example, the charge trap layer 150 may be formed to have a surface roughness that is equal to or less than about 1 nm RMS.

Each nanostructure 152 may be formed to be entirely buried in the base 151. However, it is not limited thereto, and at least one of the nanostructures 152 may be exposed from the base 151. In this case, the exposed one of the nanostructures 152 may form an interface between the charge trap layer 150 and the barrier dielectric layer 140 or an interface between the charge trap layer 150 and the tunneling dielectric layer 160.

The tunneling dielectric layer 160 may be provided on the charge trap layer 150. The tunneling dielectric layer 160 may indicate a layer in which charge tunneling occurs and may include, for example, SiO or metal oxide, but is not limited thereto.

The channel layer 170, which includes a semiconductor material, may be provided on the tunneling dielectric layer 160. The channel layer 170 may be provided to have a cylindrical shape. Also, on the channel layer 170, a filling dielectric layer 180 may be provided to fill the channel hole 190. The filling dielectric layer 180 may include, for example, SiO or air, but is not limited thereto.

In the vertical NAND flash memory device 100 according to the present embodiment, the charge trap layer 150 vertically formed on the substrate 110 may include the base 151 including the material having the excellent blocking characteristics for the charge mobility and the nanostructures 152 distributed in the base 151 and including the material having the excellent charge trap characteristics, and thus, spreading of charges may be prevented to improve the charge retention characteristics. Because the charge retention characteristics are improved as described above, a gap between the conductive layers 130 may be reduced, and thus, the vertical NAND flash memory device 100 may have high integration. For example, the gap between the conductive layers 130 may be equal to or less than about 30 nm. For example, the gap between the conductive layers 130 may be 1 nm to 20 nm. However, it is not limited thereto.

Also, the charge trap layer 150 may be formed by ALD and spinodal decomposition, and thus, the surface of the charge trap layer 150 may be formed to be relatively more uniform to improve the device uniformity.

When nanoparticles and a base material included in a charge trap layer are separately formed according to a previous nucleation and growth method, the charge trap layer may have a relatively great surface roughness corresponding to about a half of the size of the nanoparticles, for example, about 2 nm to 3 nm RMS. In this case, a tunneling dielectric layer and a channel layer formed on the charge trap layer may have increased non-uniformity, and thus, the device uniformity may deteriorate. However, according to the present embodiment, because the charge trap layer 150 may be formed via ALD and spinodal decomposition, the charge trap layer 150 may have a relatively more uniform surface compared to the related art, thereby improving the device uniformity. For example, the charge trap layer 150 may be formed to have a surface roughness that is equal to or less than about 2 nm RMS. As a specific example, the charge trap layer 150 may be formed to have a surface roughness that is equal to or less than about 1 nm RMS.

FIGS. 3 through 10 are views for describing a method of manufacturing a vertical NAND flash memory device, according to an example embodiment.

Figure 3:
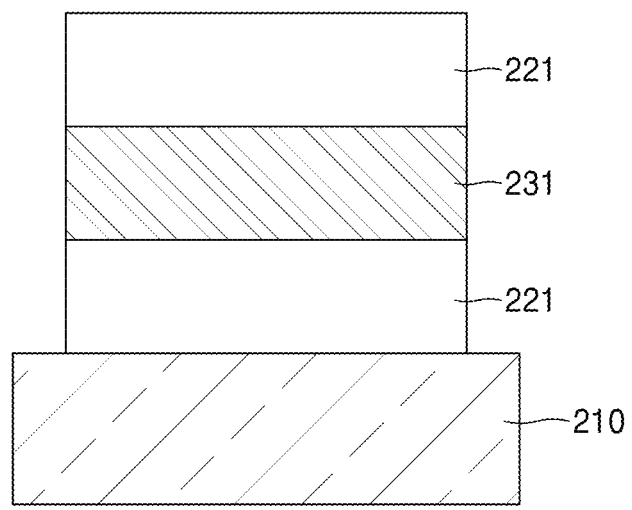
FIGS. 3 through 10 are views for describing a method of manufacturing a vertical NAND flash memory device, according to an example embodiment.

Referring to FIG. 3, a substrate 210 may be prepared. The substrate 210 may include various materials. For example, the substrate 210 may include a monocrystalline silicon substrate, a compound semiconductor substrate, or an SOI substrate, but is not limited thereto. Also, the substrate 210 may further include an impurity area doped with impurities, an electronic device such as a transistor, etc., or a peripheral circuit, etc. configured to select and control memory cells for storing data.

Next, a first layer 221 and a second layer 231 may be alternately stacked on the substrate 210. The first layer 221 and the second layer 231 may be alternately stacked in a direction vertical to a surface of the substrate 210. Also, each of the first layer 221 and the second layer 231 may be formed to extend in a direction parallel to the surface of the substrate 210.

The first layer 221 may be an insulating layer. The first layer 221 may include, for example, SiO, SiN, etc., but is not limited thereto. Also, the second layer 231 may be, for example, a conductive layer. In this case, the second layer 231 may include, for example, a metal material having excellent electrical conductivity such as Au, silicon doped with impurities, or the like, but is not limited thereto. As described below, the second layer 231 may not be a conductive layer. Rather, the second layer 231 may be an insulating layer including a different insulating material from the insulating layer corresponding to the first layer 221.

The first layer 221 and the second layer 231 may be formed by various deposition methods, for example, chemical vapor deposition (CVD), ALD, physical vapor deposition (PVD), etc.

Figure 4:
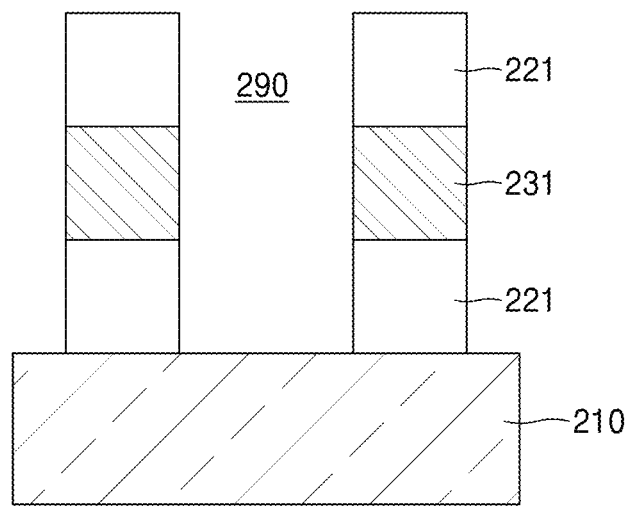

Referring to FIG. 4, a channel hole 290 may be formed through the first layer 221 and the second layer 231. Here, the channel hole 290 may be formed to extend in a direction vertical to the surface of the substrate 210. The channel hole 290 may be formed to have a circular cross-section. The channel hole 290 may be formed by anisotropic-etching the first layer 221 and the second layer 231.

Figure 5:
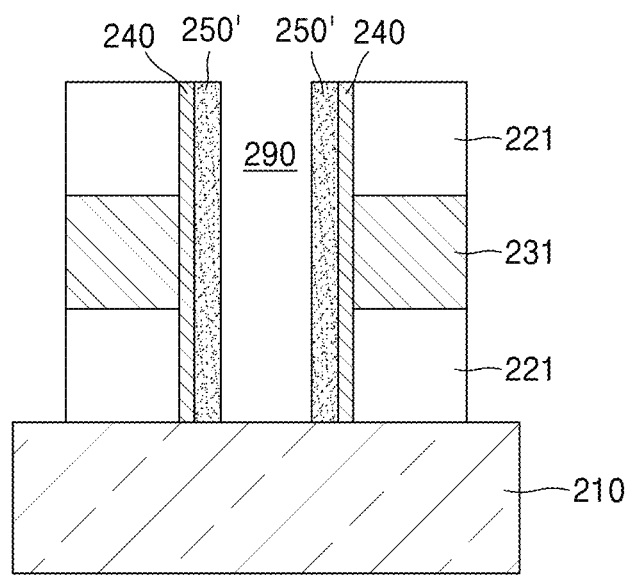

Referring to FIG. 5, a barrier dielectric layer 240 may be formed on an inner wall of the channel hole 290. The barrier dielectric layer 240 may be formed to extend in the direction vertical to the surface of the substrate 210. Here, the barrier dielectric layer 240 may be formed on the inner wall of the channel hole 290 to contact the first layer 221 and the second layer 231. The barrier dielectric layer 240 may be formed to have a cylindrical shape. The barrier dielectric layer 240 may be formed by depositing, for example, SiO, metal oxide, etc. on the inner wall of the channel layer 290 via ALD.

Next, a mixture material layer 250' may be formed on the barrier dielectric layer 240. Here, the mixture material layer 250' may indicate a layer including a mixture of a material included in a base (251 of FIG. 8) and a material included in nanostructures (252 of FIG. 8) of a charge trap layer (250 of FIG. 8).

The material included in the nanostructures 252 may have a trap density of $1 \times 10^{19}$ cm$^{-3}$ to $10 \times 10^{19}$ cm$^{-3}$. For example, the material included in the nanostructures 252 may have a trap density of $2 \times 10^{19}$ cm$^{-3}$ to $5 \times 10^{19}$ cm$^{-3}$. The nanostructures 252 may include, for example, at least one of SiN, GaN, GaO, HfO, ScO, SrO, ZrO, YO, TaO, BaO, and ZnS. However, it is not limited thereto.

The material included in the base 251 may have a CBO of 0.5 eV to 3.5 eV with respect to the material included in the nanostructures 252. For example, the material included in the base 251 may have a CBO of 1.0 eV to 2.0 eV with respect to the material included in the nanostructures 252. For example, the material included in the base 251 may have a CBO of 1.0 eV to 1.5 eV with respect to the material included in the nanostructures 252. The base 251 may include, for example, at least one of SiO, AlO, MgO, AlN, BN, and GaN. However, it is not limited thereto.

To make spinal decomposition occur as described below, formation energy according to the mixing of the material included in the base 151 and the material included in the nanostructures 152, that is, a Gibbs free-energy change ($\Delta G$), may have to be greater than 0. A combination of the materials of the nanostructures 252 and the base 251 that satisfies this condition may include, for example, a combination of HfO and SiO, a combination of HfO and AlO, a combination of SiN and AlO, or a combination of ZrO and AlO. However, it is only an example.

For example, when the nanostructures 252 include SiN and the base 251 includes AlO, a mixture of the material included in the base 251 and the material included in the nanostructures 252 may include $Al_xSi_yO$.

The mixture material layer 250' may be formed by depositing the mixture of the material included in the base 251 and the material included in the nanostructures 252 on the barrier dielectric layer 240 via ALD. Here, the mixture material layer 250' may have a metal-stable mixed phase.

The mixture material layer 250' may be formed on the barrier dielectric layer 240 by ALD, and thus, the mixture material layer 250' may have a uniform surface. For example, the mixture material layer 250' may be formed to have a surface roughness that is equal to or less than about 2 nm RMS. As a more specific example, the mixture material layer 250' may be formed to have a surface roughness that is equal to or less than 1 nm RMS.

Figure 6:
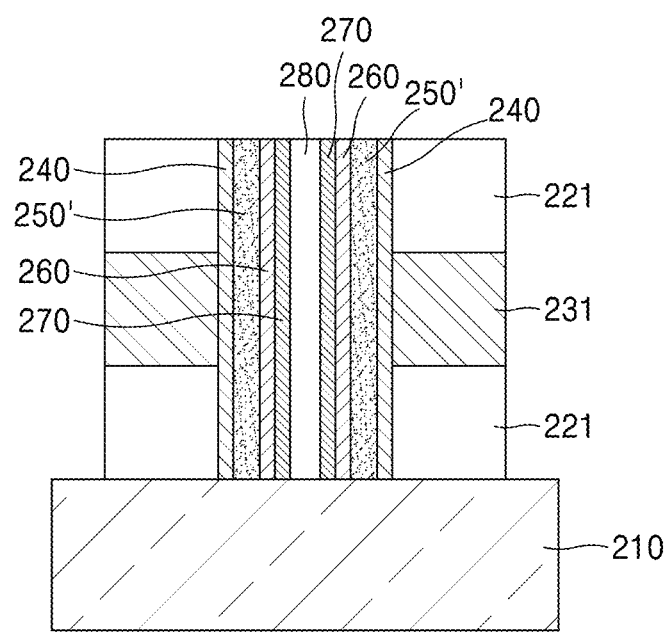

Referring to FIG. 6, a tunneling dielectric layer 260 may be formed on the mixture material layer 250'. The tunneling dielectric layer 260 may be formed by depositing, for example, SiO, metal oxide, etc., on the mixture material layer 250' via ALD. Next, a channel layer 270 may be formed on the tunneling dielectric layer 260. The channel layer 270 may be formed by depositing a semiconductor material on the tunneling dielectric layer 260 via ALD. Also, a filling dielectric layer 280 may be formed on the channel layer 270. The filling dielectric layer 280 may be formed by depositing, for example, SiO, to fill the channel layer 290, via ALD. Alternatively, the filling dielectric layer 280 may include air.

Figure 7:
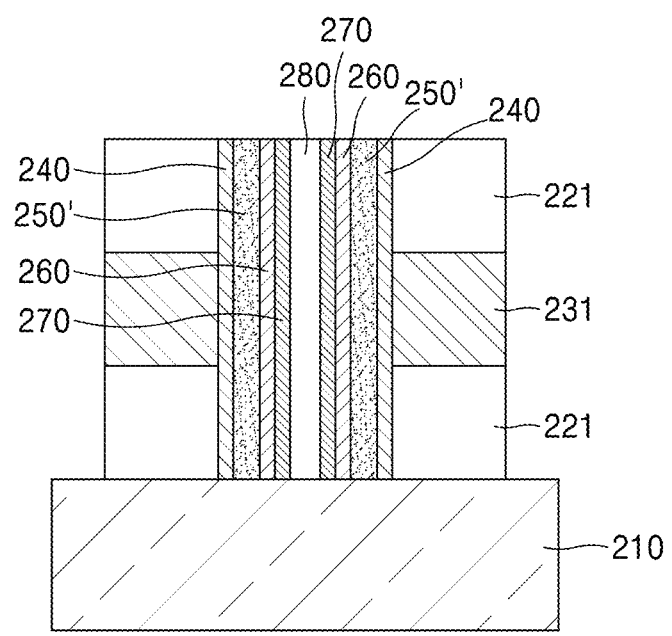
Figure 8:
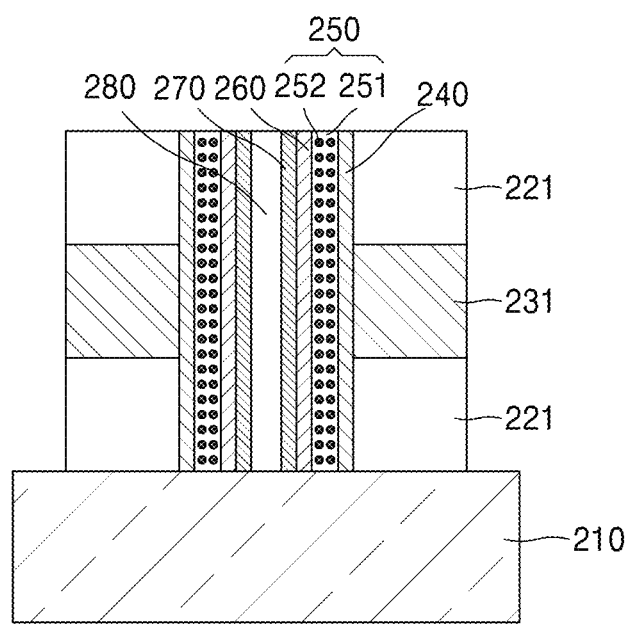

Referring to FIG. 7, a heat treatment process may be performed on a structure illustrated in FIG. 6 at desired and/or alternatively predetermined temperature. Via the heat treatment process, the spinodal decomposition may occur in the mixture material layer 250', to form the base 251 and the nanostructures 252. Here, the nanostructures 252 may be formed to be distributed in the base 251. Accordingly, as illustrated in FIG. 8, the mixture material layer 250' may be transformed into the charge trap layer 250 including the base 251 and the nanostructures 252 distributed in the base 251.

For example, the mixture material layer 250' including $Al_xSi_yO$ may be formed on the barrier dielectric layer 240 via ALD at a temperature of about 400° C., and then, a heat treatment process may be performed on the mixture material layer 250' at a temperature of about 700° C. Then, the spinodal decomposition may occur, and thus, the base 251 including AlO and the nanostructures 252 including SiN and distributed in the base 251 may be formed. However, it is only an example.

The nanostructures 252 distributed in the base 251 may have, for example, a spherical shape, an oval shape, a disk shape, or a rod shape. As described above, a size of the nanostructures 252 may be defined to have the following meaning according to a shape of the nanostructures 252. When the nanostructures 252 have a spherical shape or an oval shape, the size of the nanostructures 252 may denote an average diameter of the nanostructures 252, when the nanostructures 252 have a disk shape, the size of the nanostructures 252 may denote a thickness of the nanostructures 252, and when the nanostructures 252 have a rod shape, the size of the nanostructures 252 may denote a sectional diameter of the nanostructures 252. The nanostructures 252 may have a size of 1 nm to 20 nm. For example, the nanostructures 252 may have a size of 3 nm to 5 nm. The shape and the size of the nanostructures 252 may be adjusted according to a temperature of heat treatment on the mixture of the material included in the base 251 and the material included in the nanostructures 252.

The nanostructures 252 may be arranged in the base 251 to have a desired and/or alternatively predetermined gap between each other. Here, the gap between the nanostructures 252 may be defined to be a distance between centers of adjacent nanostructures 252. The gap between the nanostructures 252 may be 2 nm to 25 nm. For example, the gap between the nanostructures 252 may be 2 nm to 10 nm. A thickness of a base material between the nanostructures 252 may be about 1 nm to about 5 nm.

A ratio of the nanostructures 252 in the charge trap layer 250 may be about 15% to about 75%. For example, the ratio of the nanostructures 252 in the charge trap layer 250 may be about 25% to about 65%. As described above, the size and the distribution, etc. of the nanostructures 252 may be measured, for example, by a TEM analysis, an XRD analysis, or a PL analysis. However, it is not limited thereto.

In the charge trap layer 250, all of the nanostructures 252 may be formed to be buried in the base 251, or at least one of the nanostructures 252 may be exposed from the base 251. The base 251 may have an amorphous structure, and the nanostructures 252 may have a crystalline structure or an amorphous structure.

Because the charge trap layer 250 may be formed by letting the spinodal decomposition occur in the mixture material layer 250' formed by ALD, the charge trap layer 250 may have approximately the same surface roughness as the mixture material layer 250'. Accordingly, the charge trap layer 250 may have a uniform surface. For example, the charge trap layer 250 may have a surface roughness that is equal to or less than about 2 nm RMS (more specifically, equal to or less than 1 m RMS).

Above, a case in which the heat treatment process for the spinodal decomposition is performed on the structure illustrated in FIG. 6 is described. However, the disclosure is not limited thereto. The heat treatment process for the spinodal decomposition may be performed in any order of operations after the mixture material layer 250' is formed on the barrier dielectric layer 240 via ALD.

Figure 9:
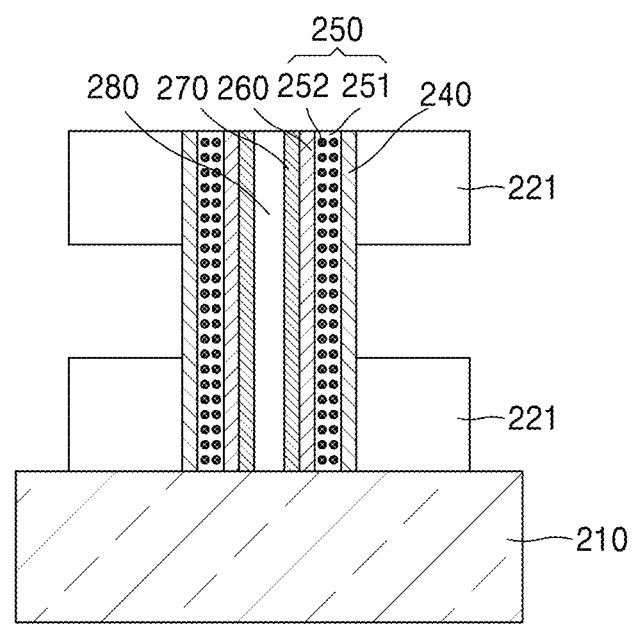
Figure 10:
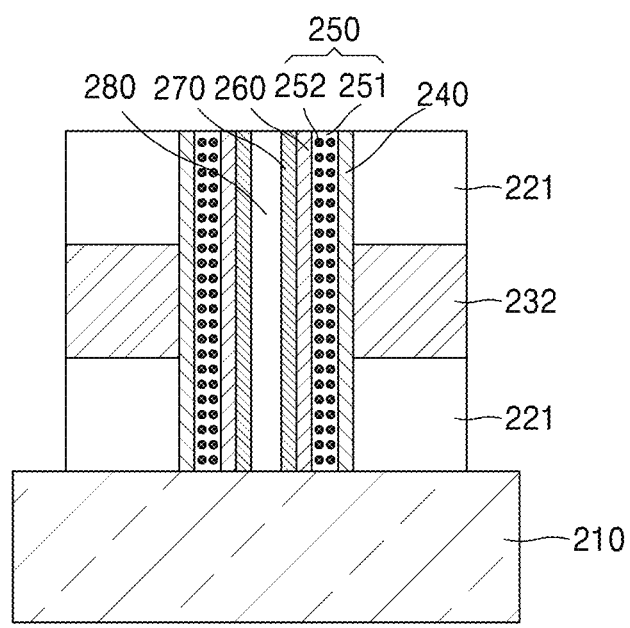

Above, a case in which the second layer 231 illustrated in FIG. 3 is a conductive layer is described. Alternatively, the second layer 231 in FIG. 3 may not be a conductive layer and may be an insulating layer including a different insulating material from an insulating material of the first layer 221. In this case, after selectively removing the second layer 231 as illustrated in FIG. 9, a conductive layer 232 may be formed at an area from which the second layer 231 is removed as illustrated in FIG. 10.

Figure 11:
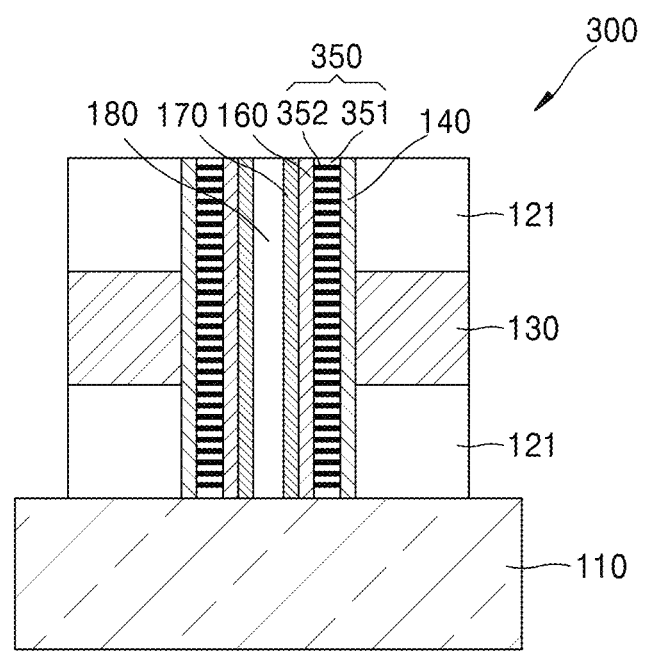
FIG. 11 is a cross-sectional view of a vertical NAND flash memory device according to another example embodiment.

FIG. 11 is a cross-sectional view of a vertical NAND flash memory device 300 according to another example embodiment. Hereinafter, aspects that are different from the aspects of the embodiments described above are mainly described.

Referring to FIG. 11, a charge trap layer 350 may include a base 351 and nanostructures 352 having a rod shape and distributed in the base 351. The base 351 and the nanostructures 352 may be formed by letting the spinodal decomposition occur in a mixture of a material included in the base 351 and a material included in the nanostructures 352 as described above.

Both ends of the nanostructures 352 may be exposed from the base 351. In this case, one exposed end of the nanostructures 352 may form an interface between the charge trap layer 350 and the barrier dielectric layer 140, and the other exposed end of the nanostructures 352 may form an interface between the charge trap layer 350 and the tunneling dielectric layer 160.

In FIG. 6, when a nucleation promotor, etc. are formed on a surface of the barrier dielectric layer 140 and a surface of the tunneling dielectric layer 160, the surfaces contacting the mixture material layer 250', nucleation and growth may begin on the surface of the barrier dielectric layer 140 and the surface of the tunneling dielectric layer 160 during the spinodal decomposition, and thus, the nanostructures 352 having the rod shape as illustrated in FIG. 11 may be formed.

Figure 12:
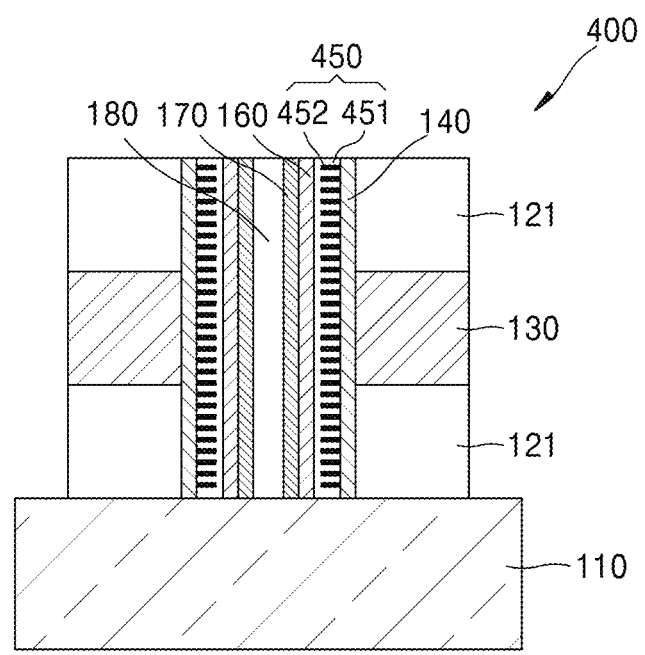
FIG. 12 is a cross-sectional view of a vertical NAND flash memory device according to another example embodiment.

FIG. 12 is a cross-sectional view of a vertical NAND flash memory device 400 according to another example embodiment.

Referring to FIG. 12, a charge trap layer 450 may include a base 451 and nanostructures 452 having a rod shape and distributed in the base 451. Here, an end of the nanostructures 452 may be exposed from the base 451, and the other end of the nanostructures 452 may be buried in the base 451. In this case, the exposed end of the nanostructures 452 may form an interface between the charge trap layer 450 and the barrier dielectric layer 140.

In FIG. 6, when a nucleation promotor, etc. are formed on a surface of the barrier dielectric layer 140, the surfaces contacting the mixture material layer 250', nucleation and growth may begin on the surface of the barrier dielectric layer 140 during the spinodal decomposition, and thus, the nanostructures 452 having the rod shape as illustrated in FIG. 12 may be formed.

Figure 13:
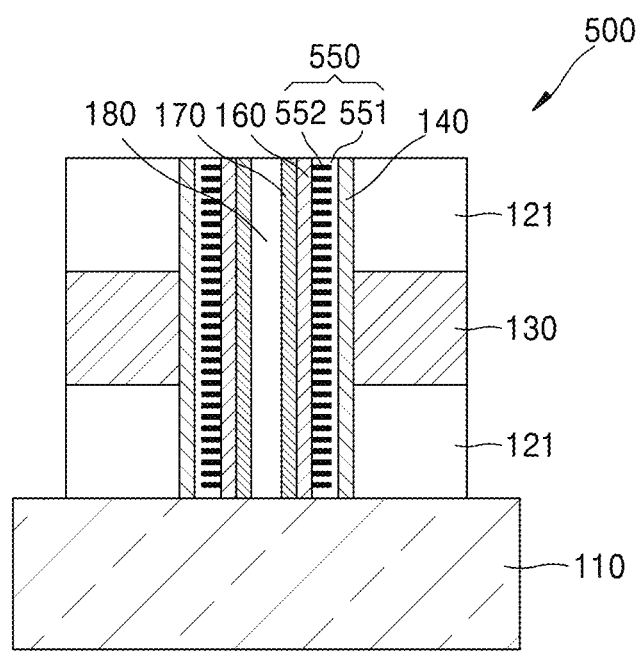
FIG. 13 is a cross-sectional view of a vertical NAND flash memory device according to another example embodiment.

FIG. 13 is a cross-sectional view of a vertical NAND flash memory device 500 according to another example embodiment.

Referring to FIG. 13, a charge trap layer 550 may include a base 551 and nanostructures 552 having a rod shape and distributed in the base 551. Here, an end of the nanostructures 552 may be exposed from the base 551, and the other end of the nanostructures 552 may be buried in the base 551. In this case, the exposed end of the nanostructures 552 may form an interface between the charge trap layer 550 and the tunneling dielectric layer 160.

In FIG. 6, when a nucleation promotor, etc. are formed on a surface of the tunneling dielectric layer 160, the surface contacting the mixture material layer 250', nucleation and growth may begin on the surface of the tunneling dielectric layer 160 during the spinodal decomposition, and thus, the nanostructures 552 having the rod shape as illustrated in FIG. 13 may be formed.

Above, the cases are described in which at least one of both ends of the nanostructures 352, 452, and 552 having the rod shape is exposed from the bases 351, 451, and 551, respectively. However, the disclosure is not limited thereto, and the nanostructures 352, 452, and 552 having the rod shape may be buried in the bases 351, 451, and 551, respectively.

Figure 14:
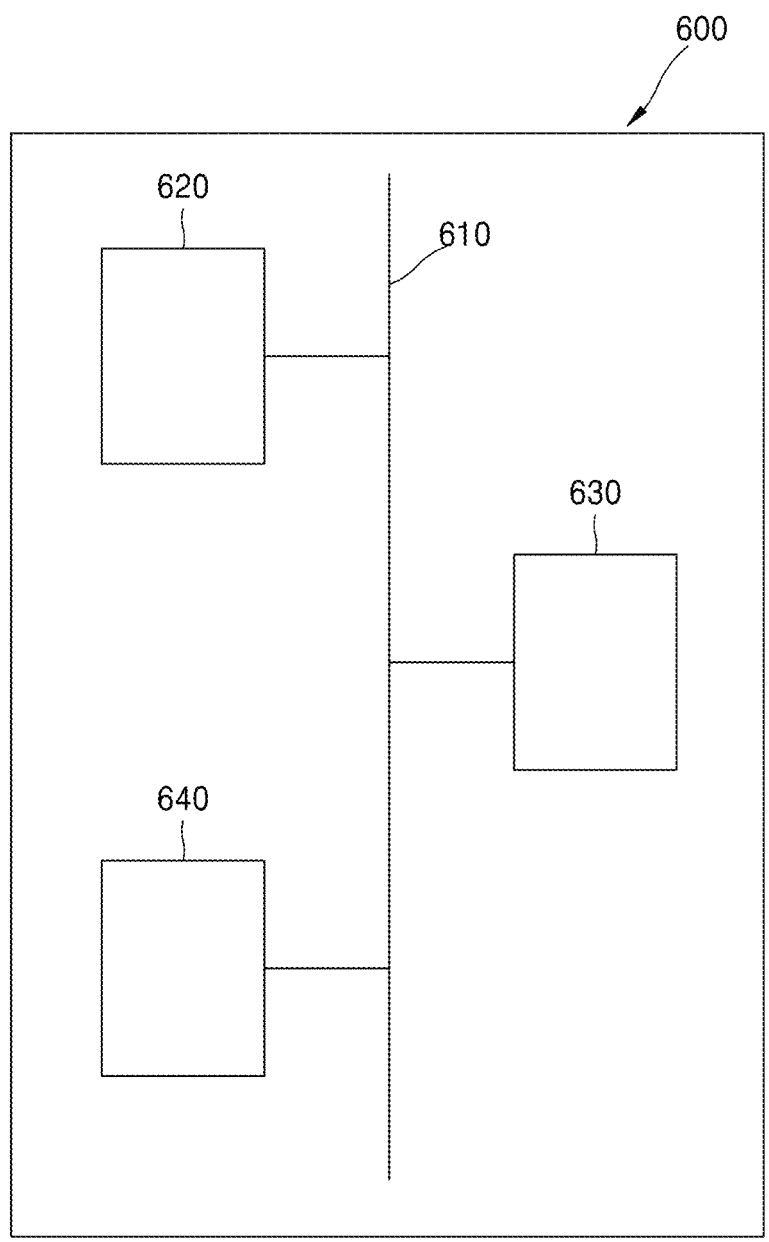
FIG. 14 is a block diagram of an electronic device according to an embodiment.

FIG. 14 is a block diagram of an electronic device according to an embodiment.

Referring to FIG. 14, an electronic device 600 may include a processor 620, a memory 630, and a device 640 (e.g., image sensor and/or display device) that are electrically coupled together via a bus 610. The device 640 may be an image sensor (e.g., a device including CMOS image sensor circuit) and/or a display device (e.g., a LED display, a holographic display). The memory 630, which may be a non-transitory computer readable medium, may store a program of instructions and/or other information. The memory 630 may be a nonvolatile memory, such as a vertical NAND flash memory device according to one of the embodiments discussed above. The processor 620 may execute the stored program of instructions to perform one or more functions. For example, when the device 640 includes a sensor such as an image sensor, the processor 620 may be configured to process electrical signals generated by the device 640. Additionally, when the device includes a display device, the processor 620 may be configured to generate an output (e.g., an image to be displayed on a display) based on such processing and/or information received from an external host (not shown).

As described above, in the vertical NAND flash memory device according to an example embodiment, the charge trap layer vertically formed on the substrate may include the base including the material having the excellent blocking characteristics for a charge mobility and the nanostructures distributed in the base and including the material having the excellent charge trap characteristics, and thus, spreading of charges may be limited and/or prevented to improve the charge retention characteristics. Also, the charge trap layer may be formed by ALD and spinodal decomposition, and thus, the surface of the charge trap layer may be formed to be relatively more uniform to improve the device uniformity. The NAND flash memory device may be applied in an electronic device including a processor and/or other components. Embodiments are described above. However, these are examples, and one of ordinary skill in the art may achieve various modifications based on the embodiments.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A vertical NAND flash memory device comprising:
    a substrate;
    a structure on the substrate including a plurality of conductive layers arranged in parallel to an upper surface of the substrate, the structure including a channel hole formed vertical to the substrate and penetrating the of plurality of conductive layers;
    a charge trap layer on an inner wall of the channel hole, the charge trap layer including a base and nanostructures distributed in the base; and
    a channel layer on the charge trap layer, wherein
    a material included in the nanostructures has a trap density of about $1\times10^{19}$ cm$^{-3}$ to about $10\times10^{19}$ cm$^{-3}$, and
    a material included in the base has a conduction band offset (CBO) of about 0.5 eV to about 3.5 eV with respect to the material in the nanostructures, wherein
    the charge trap layer is formed by inducing spinodal decomposition through a heat treatment process on a mixture of the material included in the base and the material included in the nanostructures, and
    the base has an amorphous structure after the spinodal decomposition is induced, and
    the nanostructures have a crystalline structure or an amorphous structure after the spinodal decomposition is induced.

2. The vertical NAND flash memory device of claim 1, wherein the trap density of the material included in the nanostructures is about $2\times10^{19}$ cm$^{-3}$ to about $5\times10^{19}$ cm$^{-3}$.

3. The vertical NAND flash memory device of claim 1, wherein the material included in the base has a higher band gap than the material included in the nanostructures.

4. The vertical NAND flash memory device of claim 3, wherein the CBO of the material included in the base is about 1.0 eV to about 2.0 eV with respect to the material included in the nanostructures.

5. The vertical NAND flash memory device of claim 1, wherein the nanostructures include at least one of SiN, GaN, GaO, HfO, ScO, SrO, ZrO, YO, TaO, BaO, and ZnS.

6. The vertical NAND flash memory device of claim 5, wherein the base includes at least one of SiO, AlO, MgO, AlN, BN, and GaN.

7. The vertical NAND flash memory device of claim 6, wherein a combination of the material included in the nanostructures and the material included in the base includes a combination of HfO and SiO, a combination of HfO and AlO, a combination of SiN and AlO, or a combination of ZrO and AlO.

8. The vertical NAND flash memory device of claim 1, wherein a size of the nanostructures is about 1 nm to about 20 nm.

9. The vertical NAND flash memory device of claim 8, wherein the size of the nanostructures is about 3 nm to about 5 nm.

10. The vertical NAND flash memory device of claim 1, wherein a gap between the nanostructures is about 2 nm to about 25 nm.

11. The vertical NAND flash memory device of claim 10, wherein the gap between the nanostructures is about 2 nm to about 10 nm.

12. The vertical NAND flash memory device of claim 1, wherein a ratio of a volume of the nanostructures in the charge trap layer to a volume of the charge trap layer is about 15% to about 75%.

13. The vertical NAND flash memory device of claim 12, wherein the ratio of the volume of the nanostructures in the charge trap layer to the volume of the charge trap layer is about 25% to about 60%.

14. The vertical NAND flash memory device of claim 1, wherein the charge trap layer has a surface roughness that is equal to or less than about 2 nm root-mean-square (RMS).

15. The vertical NAND flash memory device of claim 1, wherein the nanostructures are buried in the base.

16. The vertical NAND flash memory device of claim 1, wherein at least one of the nanostructures is exposed from the base.

17. The vertical NAND flash memory device of claim 1, wherein a gap between the conductive layers is equal to or less than about 30 nm.

18. The vertical NAND flash memory device of claim 1, wherein
the structure on the substrate includes an insulating layer between the plurality of conductive layers, and
the insulating layer extends parallel to the substrate.

19. The vertical NAND flash memory device of claim 1, further comprising:
a barrier dielectric layer is between the charge trap layer and the plurality of conductive layers.

20. The vertical NAND flash memory device of claim 19, further comprising:
a tunneling dielectric layer between the charge trap layer and the channel layer.

21. The vertical NAND flash memory device of claim 20, further comprising:
a filling dielectric layer on an inner side of the channel layer, wherein
the filling dielectric layer fills the channel hole.

22. A vertical NAND flash memory device comprising:
a substrate;
a plurality of conductive layers and a plurality of insulating layers alternately stacked on an upper surface of the substrate, the plurality of conductive layers and the plurality of insulating layers defining a channel hole extending in a vertical direction through the plurality of conductive layers and the plurality of insulating layers; and
a channel structure in the channel hole, the channel structure including a channel layer extending in the vertical direction, the channel structure including a plurality of nanostructures distributed in a base between the channel layer and a sidewall of the channel hole, and a material included in the plurality of nanostructures has a lower band gap compared to a material included in the base, wherein
the material included in the nanostructures has a trap density of about $1\times10^{19}$ cm$^{-3}$ to about $10\times10^{19}$ cm$^{-3}$, and
a conduction band offset (CBO) of the material included in the base with respect to the material included in the nanostructures is about 0.5 eV to about 3.5 eV wherein
the channel structure includes a charge trap layer containing the plurality of nanostructures distributed in the base, and
the charge trap layer is formed by inducing spinodal decomposition through a heat treatment process on a mixture of the material included in the base and the material included in the nanostructures, and
the base has an amorphous structure after the spinodal decomposition is induced, and
the nanostructures have a crystalline structure or an amorphous structure after the spinodal decomposition is induced.

23. The vertical NAND flash memory device of claim 22, wherein
the plurality of nanostructures have at least one of a spherical shape, an oval shape, and a rod shape.

24. The vertical NAND flash memory device of claim 22, wherein
the material included in the plurality of nanostructures include at least one of SiN, GaN, GaO, HfO, ScO, SrO, ZrO, YO, TaO, BaO, and ZnS, and
the material included in the base includes at least one of SiO, AlO, MgO, AlN, BN, and GaN.

25. The vertical NAND flash memory device of claim 22, wherein the channel structure includes at least one of:
a barrier dielectric layer between the channel layer and plurality of nanostructures distributed in the base; and
a tunneling dielectric layer between the channel layer and plurality of nanostructures distributed in the base.

26. The vertical NAND flash memory device of claim 22, wherein
a surface roughness of the charge trap layer is equal to or less than about 2 nm RMS.

* * * * *